United States Patent
Yamamoto et al.

(10) Patent No.: US 7,177,128 B2
(45) Date of Patent: Feb. 13, 2007

(54) SNUBBER MODULE AND POWER CONVERSION DEVICE

(75) Inventors: Eiji Yamamoto, Fukuoka (JP); Hidenori Hara, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 10/526,380

(22) PCT Filed: Aug. 25, 2003

(86) PCT No.: PCT/JP03/10709

§ 371 (c)(1), (2), (4) Date: Mar. 3, 2005

(87) PCT Pub. No.: WO2004/027966

PCT Pub. Date: Apr. 1, 2004

(65) Prior Publication Data

US 2005/0270715 A1   Dec. 8, 2005

(30) Foreign Application Priority Data

Sep. 4, 2002 (JP) .............................. 2002-258794

(51) Int. Cl.
*H02H 3/20* (2006.01)
(52) U.S. Cl. .................................................. 361/91.7
(58) Field of Classification Search ................ 361/91.7
See application file for complete search history.

(56) References Cited

U.S. PATENT DOCUMENTS 5,055,990 A * 10/1991 Miki et al. ............... 363/56.05
5,512,782 A * 4/1996 Kobayashi ................... 257/691

FOREIGN PATENT DOCUMENTS

| EP | 0 379 346 A2 | 7/1990 |
|----|--------------|--------|
| JP | 6-14562 A | 1/1994 |
| JP | 6-77259 A | 10/1994 |
| JP | 8-251908 A | 9/1996 |
| JP | 11-146649 A | 5/1999 |
| JP | 2000-102241 A | 4/2000 |
| JP | 2000-316285 A | 11/2000 |
| JP | 2002-137871 A | 5/2002 |
| JP | 2002-141464 A | 5/2002 |

* cited by examiner

*Primary Examiner*—Chau N. Nguyen
*Assistant Examiner*—Scott Bauer
(74) *Attorney, Agent, or Firm*—Sughrue Mion, PLLC

(57) ABSTRACT

It is an object of the invention to realize a snubber module which is small in size, and which can be easily handled, thereby miniaturizing a power conversion apparatus.

In the invention, a snubber module (10) is configured so that twelve snubber diodes and a snubber capacitor which constitute a snubber circuit for suppressing a surge voltage are enclosed in a resin mold (101), and a P-side lead wire (103) and an N-side lead wire (104) which are two capacitor external terminals that are connected respectively to two terminals of the snubber capacitor, and six diode external terminals (102) which are connected respectively to connecting portions where respective two of the twelve snubber diodes are connected to each other are exposed from the resin mold (101).

2 Claims, 5 Drawing Sheets

PRIOR ART

SNUBBER MODULE AND POWER CONVERSION DEVICE

TECHNICAL FIELD

The present invention relates to a power conversion apparatus comprising a semiconductor switch module which can bidirectionally supply a power between three terminals, and more particularly to a power conversion apparatus in which a snubber circuit for suppressing a surge voltage in the semiconductor switch module is configured.

BACKGROUND ART

Conventionally, as a power conversion apparatus being configured by a semiconductor switch module, which can bidirectionally supply a power, and a snubber circuit for suppressing a surge voltage, a circuit configuration such as shown in FIG. 3 is known. (For example, see Patent Reference 1 or Japanese Patent Application No. 2002-137871.) The snubber circuit is configured by: snubber diodes D1 to D12; a snubber capacitor 40; and a snubber discharge circuit 30, and suppresses a surge voltage which is generated in switching of a semiconductor switching device, thereby preventing the semiconductor switching device from being broken down. The semiconductor switch module 20 is configured by eighteen high-reverse breakdown voltage IGBTs (Insulated Gate Bipolar Transistors) $50_1$ to $50_{18}$ which are semiconductor switching devices having a self arc-extinguishing ability and a reverse withstand characteristic, so that a power can be bidirectionally supplied between input terminals 201 and output terminals 202.

In the semiconductor switch module 20, two of the eighteen high-reverse breakdown voltage IGBTs $50_1$ to $50_{18}$ are connected in antiparallel to each other to constitute one bidirectional switch, thereby constituting nine bidirectional switches. Three bidirectional switch groups each configured by three bidirectional switches are connected to the three input terminals 201 and one of the three output terminals 202, respectively.

In the snubber circuit, a clamped snubber circuit is formed by the snubber diodes D1 to D12 which are high-speed diodes having an excellent reverse recovery characteristic, at the input terminals 201 and output terminals 202 (R, S, T, U, V, W) of the semiconductor switch module 20, and both ends of the clamped snubber circuit are connected to the snubber capacitor 40 which stores an absorbed surge voltage. Sometimes, the snubber discharge circuit 30 for discharging when the voltage of the snubber capacitor 40 is raised is further disposed.

FIG. 4 shows the appearance of the semiconductor switch module 20 shown in FIG. 3. In the semiconductor switch module 20 shown in FIG. 4, the eighteen high-reverse breakdown voltage IGBTs $50_1$ to $50_{18}$ are enclosed in a resin mold 200. In the semiconductor switch module 20, the input terminals 201, the output terminals 202, mounting holes 203, and semiconductor switch driving gate terminals 204 are configured so as to be exposed to the outside of the resin mold 200. The semiconductor switch driving gate terminals 204 are connected to gate terminals of the high-reverse breakdown voltage IGBTs $50_1$ to $50_{18}$, respectively, and a control signal is connected to the semiconductor switch driving gate terminals 204 to control the switching operations of the high-reverse breakdown voltage IGBTs $50_1$ to $50_{18}$.

For example, the snubber diode D1 has a shape as shown in FIG. 5, and an anode terminal A1 and a cathode terminal K1 have a thread shape. A snubber circuit using such discrete snubber diodes is configured as shown in FIG. 6. More specifically, the anode terminals A1 and cathode terminals K1 of the snubber diodes having the configuration shown in FIG. 5 are connected to one other to form serial diodes, lead wires are drawn out from connections of the anode terminals A1 and the cathode terminals K1 in the serial diodes, and the lead wires are connected to the input and output terminals 201, 202 of the semiconductor switch module 20. Among ends of the serial diodes, the cathode terminals K1 are connected to P-side bus bars 1, 2, and the other terminals, or the anode terminals A1 are connected to N-side bus bars 3, 4. The P-side bus bars 1, 2, and the N-side bus bars 3, 4 are connected to the snubber capacitor 40 through P-side lead wires 103, and N-side lead wires 104.

[Patent Reference 1]
JP-A-11-146649

DISCLOSURE OF THE INVENTION

In the above-described conventional power conversion apparatus, the snubber circuit is configured by discrete components, and hence it is difficult to miniaturize the circuit. Moreover, the wirings are long, so that the inductance of the wirings is increased and the effect of the snubber circuit that a surge voltage is suppressed is lowered. Since the snubber diodes are exposed, there is a further problem in that measures for insulation are required.

It is an object of the invention to provide a snubber module and a power conversion apparatus in which a snubber circuit can be easily miniaturized, wirings can be shortened, and measures for insulation are facilitated.

In order to attain the object, the power conversion apparatus of the invention is configured by a snubber module of a snubber circuit for suppressing a surge voltage, comprising twelve snubber diodes and a snubber capacitor, and a resin mold in which said snubber diodes and said snubber capacitor are enclosed, wherein two capacitor external terminals, which are connected to two terminals of said snubber capacitor respectively, and six diode external terminals, each of which is connected to a connecting portion of respective two of said twelve snubber diodes, are exposed from said resin mold.

According to the invention, the snubber diodes and the snubber capacitor which constitute a snubber circuit are enclosed in the resin mold, and hence it is possible to realize a snubber module which is smaller in size than that in the case where a snubber circuit is configured by wiring discrete components. Furthermore, wirings can be shortened as compared with the case where discrete snubber circuits are connected to one another by wirings, and therefore the wiring inductance can be reduced. Components exposed from the snubber module are restricted only to the six diode external terminals and the capacitor external terminals, and other wirings are not exposed. Therefore, measures for insulation are facilitated.

In the snubber module of the invention, the snubber circuit may be configured by:

at least six sets of serial diodes each of which is configured by two snubber diodes, an anode terminal of one of said snubber diodes being connected to a cathode terminal of another one of said snubber diodes, and said connecting portion is a connecting portion of said anode and said cathode terminals; and a snubber capacitor in which one terminal is connected commonly to anode terminals of the serial diodes on a side that is not connected to the six diode external terminals, and another terminal is connected commonly to cathode terminals of the serial diodes on a side that is not connected to the six diode external terminals.

In the snubber module of the invention, the six diode external terminals may be configured so as to have the same intervals as those being configured for input and output terminals of a semiconductor switch module which can bidirectionally supply a power between three terminals.

According to the invention, the six diode external terminals of the snubber module are configured so as to have the same intervals as the input and output terminals of the semiconductor switch module. Therefore, the snubber module and the semiconductor switch module can be connected to each other by connecting screws, so that attachment to and detachment from the semiconductor switch module are facilitated.

In order to attain the object, the power conversion apparatus of the invention is configured by: a semiconductor switch module which is configured by eighteen semiconductor switching devices having a self arc-extinguishing ability and a reverse withstand characteristic, and in which two of the eighteen semiconductor switching devices are connected in antiparallel to each other to constitute one bidirectional switch, thereby constituting nine bidirectional switches, and three bidirectional switch groups each configured by three bidirectional switches are connected to three input terminals and one output terminal, respectively; and a snubber module according to any one of claims 1 to 3 in which the six diode terminal terminals are connected to the input and output terminals of the semiconductor switch module, respectively.

According to the invention, the power conversion apparatus is configured by using the snubber module in which the snubber circuit is enclosed in the resin mold. Therefore, the power conversion apparatus can be miniaturized as compared with the case where a snubber circuit is configured by discrete components.

Figure 1:
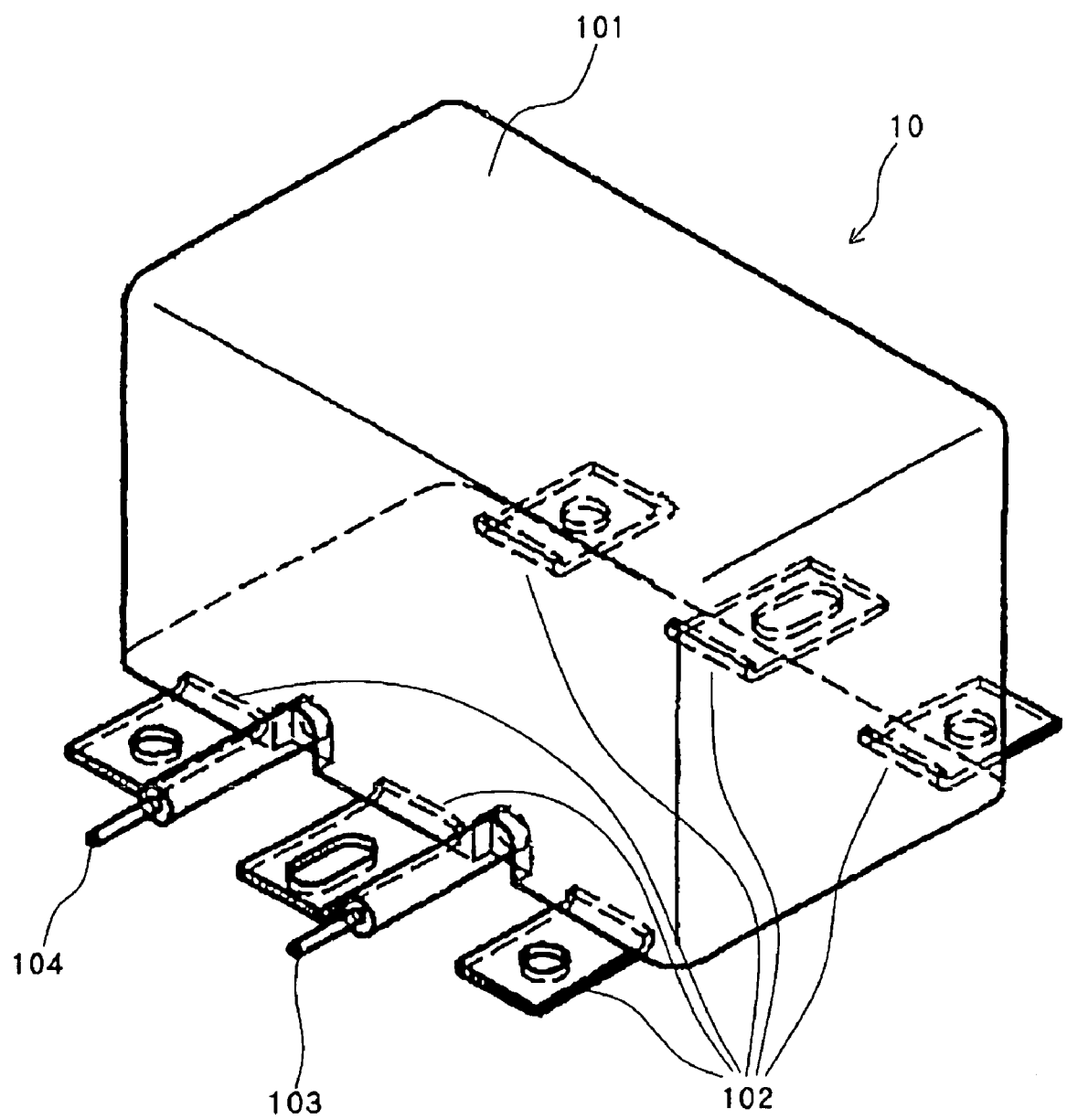
FIG. 1 is an external view showing the structure of a snubber module 10 of an embodiment of the invention.

In the figures, reference numerals denote components as follows:
1, 2 P-side bus bar
3, 4 N-side bus bar
10 snubber module
20 semiconductor switch module
30 snubber discharge circuit
40 snubber capacitor
$50_1$ to $50_{18}$ high-reverse breakdown voltage IGBT
101 resin mold
102 lead terminal
103 P-side lead wire
104 N-side lead wire
200 resin mold
201 input terminal
202 output terminal
203 mounting hole
204 semiconductor switch driving gate terminal
300 connecting screw
D1 to D12 snubber diode
A1 anode terminal
K1 cathode terminal

BEST MODE FOR CARRYING OUT THE INVENTION

Next, an embodiment of the invention will be described in detail with reference to the drawings.

FIG. 1 is an external view showing the structure of a snubber module 10 of an embodiment of the invention. In FIG. 1, the components identical with those in the configuration of the conventional power conversion apparatus shown in FIGS. 3 and 4 are denoted by the same reference numerals as far as possible, and duplicated description will be omitted.

Figure 3:
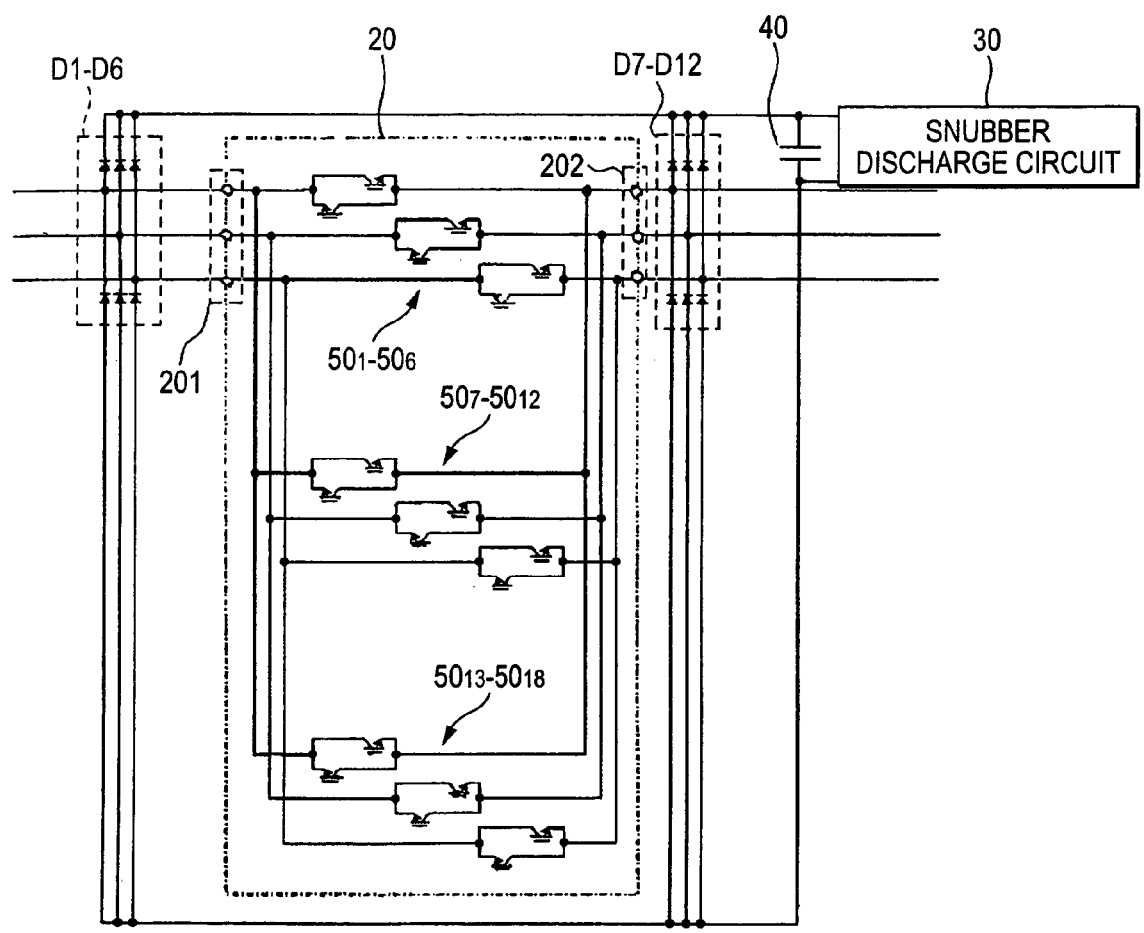
FIG. 3 is a circuit diagram of the semiconductor switch module and a snubber circuit for suppressing a surge.
Figure 4:
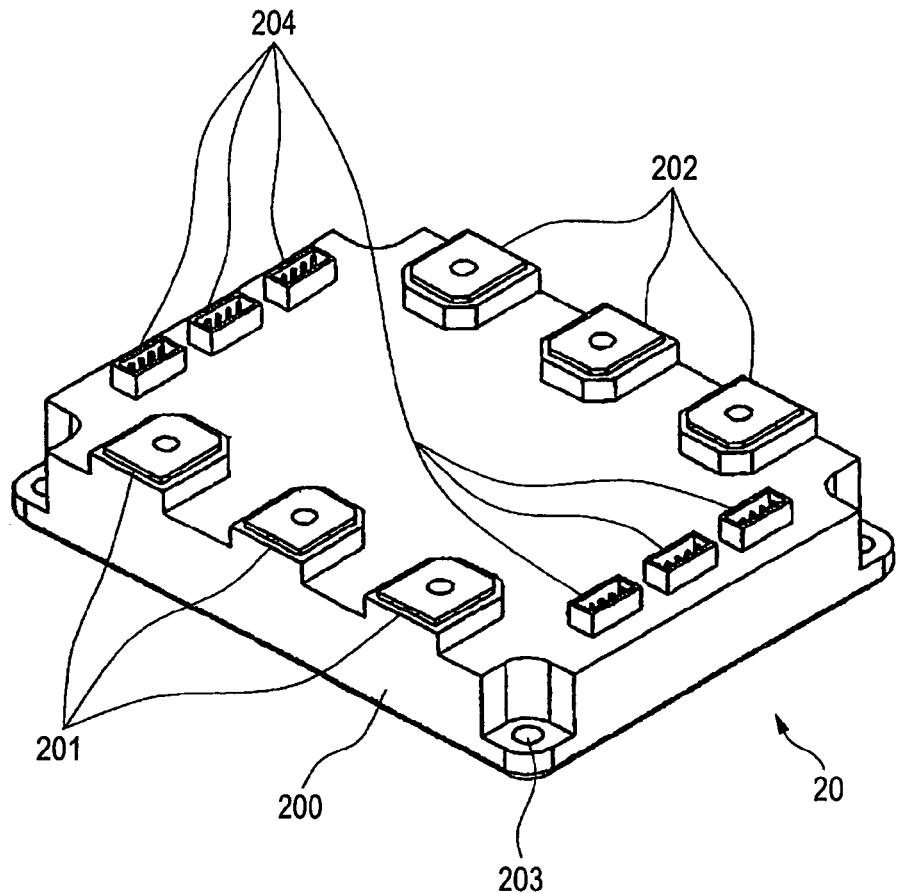
FIG. 4 is an external view showing the structure of the semiconductor switch module 20 shown in FIG. 3.

The snubber module 10 of the embodiment is formed by enclosing the snubber diodes D1 to D12 and the snubber capacitor 40 which are shown in FIG. 3, in a resin mold 101. The snubber module 10 has a configuration in which lead terminals 102, a P-side lead wire 103, and an N-side lead wire 104 are exposed to the outside of the resin mold 101.

The six lead terminals 102 are diode external terminals, and are connected to connecting portions to which anode and cathode terminals of the serial diodes are connected, via lead conductors having excellent electrical conductivity. The P-side lead wire 103 and the N-side lead wire 104 are capacitor external terminals, and connected to the snubber capacitor 40 enclosed in the resin mold 101, via lead conductors having excellent electrical conductivity. In the embodiment, it has been described that the P-side lead wire 103 and the N-side lead wire 104 are configured by wirings. Alternatively, the lead wires may be formed into a terminal shape.

Figure 2:
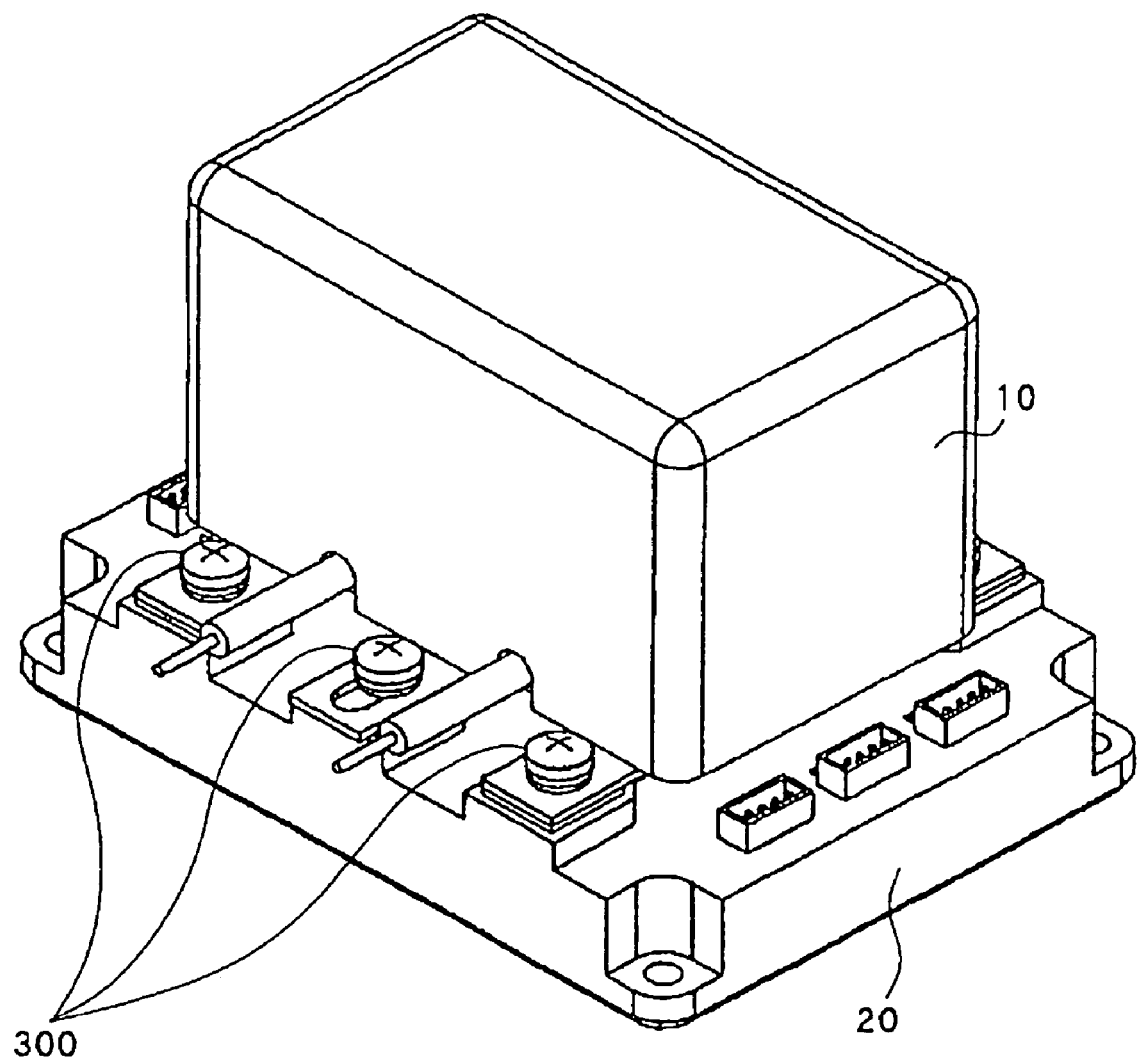
FIG. 2 is a view of a combination of the snubber module 10 of an embodiment of the invention, and a semiconductor switch module 20.

FIG. 2 is a view showing a structure in which the snubber module 10 of the embodiment is attached to the semiconductor switch module 20. The snubber module 10 and the semiconductor switch module 20 are configured so as to have the same terminal intervals, and hence can be attached by connecting screws 300. The semiconductor switch driving gate terminals 204 are disposed on an edge which is different from the edge where the input terminals 201 and the output terminals 202 are disposed. Therefore, wiring can be easily conducted on the semiconductor switch driving gate terminals 204 in a state where the snubber module 10 is screwingly fastened to the semiconductor switch module 20.

As described above, in the snubber module 10 of the embodiment, the snubber diodes D1 to D12 and the snubber capacitor 40 which constitute a snubber circuit are enclosed in the resin mold 101. As compared with the case where a snubber circuit is configured by wiring discrete components, therefore, the power conversion apparatus can be miniaturized, and it is possible to realize the snubber module 10 of a small size. As compared with the case where discrete snubber circuits are connected to one another by wirings, moreover, wirings can be shortened, and therefore the wiring inductance can be reduced. Consequently, the surge voltage suppressing effect due to the snubber circuit can be enhanced. Components exposed from the snubber module 10 are restricted only to the lead terminals 102, the P-side lead wire 103, and the N-side lead wire 104, and the other wirings are not exposed. Therefore, measures for insulation are facilitated. Moreover, the connection with the snubber module 20 is conducted by the connecting screws 300, and hence attachment to and detachment from the semiconductor switch module 20 are facilitated. Since the resin mold 101 is provided, also the handling is facilitated.

Figure 5:
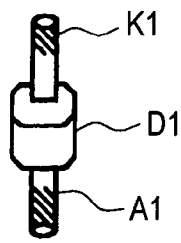
FIG. 5 is an external view of a discrete snubber diode D1.
Figure 6:
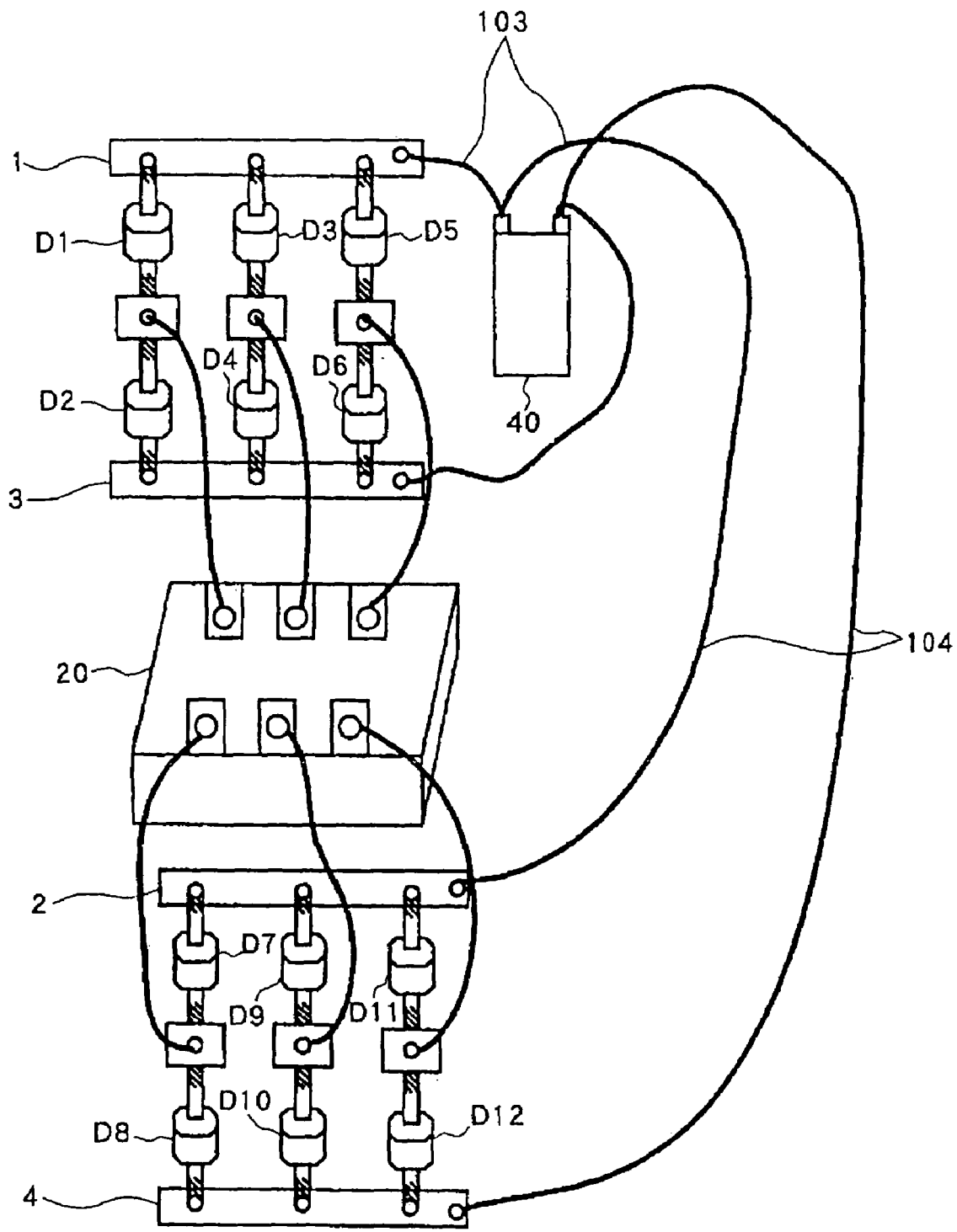
FIG. 6 is a view of a configuration of a conventional power conversion apparatus in which a snubber circuit is disposed in a semiconductor switch module 20.

The embodiment has been described with using the case where the snubber diodes which are enclosed in the resin mold 101 have the shape such as shown in FIG. 5. However, the invention is not restricted to this. The invention can be similarly applied to a case where diodes having a shape such as a TO-3P package are to be enclosed. In place of the enclosing of the discrete type diodes in the resin mold 101, enclosing of diode chips in the resin mold 101 may be employed. When diode chips are directly enclosed in the resin mold 101 in this way, further miniaturization can be enabled as compared with the case where discrete type diodes are enclosed.

Although the invention has been described in detail with reference to a specific embodiment, it is obvious to those skilled in the art that various changes and modifications can be made without departing from the spirit and scope of the invention.

The present application is based on Japanese Patent Application (No. 2002-258794) filed Sep. 4, 2002, and its contents are incorporated herein by reference.

INDUSTRIAL APPLICABILITY

As described above, according to the invention, a snubber circuit is enclosed in a resin mold. Therefore, a small snubber module can be realized, so that a power conversion apparatus can be miniaturized, and moreover it is possible to attain effects that a wiring inductance can be reduced, and that facilitation of measures for insulation can be facilitated.

The invention claimed is:

1. A snubber module of a snubber circuit for suppressing a surge voltage, comprising twelve snubber diodes and a snubber capacitor, and a resin mold in which said snubber diodes and said snubber capacitor are enclosed, wherein two capacitor external terminals and six diode external terminals are exposed from said resin mold, wherein the two capacitor external terminals are connected to two terminals of said snubber capacitor respectively, and each of said six diode external terminals is connected to a connecting portion of respective two of said twelve snubber diodes, wherein said snubber circuit is configured by:

at least six sets of serial diodes each of which is configured by two snubber diodes, an anode terminal of one of said snubber diodes being connected to a cathode terminal of another one of said snubber diodes, and said connecting portion connecting said anode terminal and said cathode terminal; and a snubber capacitor in which one terminal is connected commonly to anode terminals of said serial diodes on a side that is not connected to said six diode external terminals and another terminal is connected commonly to cathode terminals of said serial diodes on a side that is not connected to said six diode external terminals, and wherein said six diode external terminals are configured to be spaced at the same intervals as input and output terminals of a semiconductor switch module which can bidirectionally supply a power between three terminals.

2. A power conversion apparatus wherein said apparatus is configured by: a semiconductor switch module which is configured by eighteen semiconductor switching devices having a self arc-extinguishing ability and a reverse withstand characteristic, and in which two of said eighteen semiconductor switching devices are connected in antiparallel to each other to constitute one bidirectional switch, thereby constituting nine bidirectional switches, and three bidirectional switch groups each configured by three bidirectional switches are connected to three input terminals and three output terminals, respectively; and a snubber module in which said six diode external terminals are connected to said input and output terminals of said semiconductor switch module, respectively the snubber module further comprising twelve snubber diodes and a snubber capacitor, and a resin mold in which said snubber diodes and said snubber capacitor are enclosed, wherein two capacitor external terminals and six diode external terminals are exposed from said resin mold, wherein the two capacitor external terminals are connected to two terminals of said snubber capacitor respectively, and each of said six diode external terminals is connected to a connecting portion of respective two of said twelve snubber diodes wherein said snubber circuit is configured by:

at least six sets of serial diodes each of which is configured by two snubber diodes, an anode terminal of one of said snubber diodes being connected to a cathode terminal of another one of said snubber diodes, and said connecting portion connecting said anode terminal and said cathode terminal; and a snubber capacitor in which one terminal is connected commonly to anode terminals of said serial diodes on a side that is not connected to said six diode external terminals, and another terminal is connected commonly to cathode terminals of said serial diodes on a side tat is not connected to said six diode external terminals, and wherein said six diode external terminals are configured to be spaced at the same intervals as input and output terminals of a semiconductor switch module which can bidirectionally supply a power between three terminals.

* * * * *